(12) United States Patent
Lee et al.

(10) Patent No.: US 11,175,443 B2
(45) Date of Patent: Nov. 16, 2021

(54) OPTICAL FILTER FOR ANTI-REFLECTION AND ORGANIC LIGHT-EMITTING DEVICE

(71) Applicant: LG CHEM, LTD., Seoul (KR)

(72) Inventors: Ji Youn Lee, Daejeon (KR); Sergey Belyaev, Daejeon (KR); Sin Young Kim, Daejeon (KR); Sun Kug Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/500,728

(22) PCT Filed: Apr. 20, 2018

(86) PCT No.: PCT/KR2018/004628
§ 371 (c)(1),
(2) Date: Oct. 3, 2019

(87) PCT Pub. No.: WO2018/194421
PCT Pub. Date: Oct. 25, 2018

(65) Prior Publication Data
US 2020/0200958 A1 Jun. 25, 2020

(30) Foreign Application Priority Data
Apr. 20, 2017 (KR) .......... 10-2017-0050948

(51) Int. Cl.
*G02F 1/1335* (2006.01)
*G02B 5/30* (2006.01)
*H01L 51/52* (2006.01)

(52) U.S. Cl.
CPC ........ *G02B 5/3016* (2013.01); *H01L 51/5281* (2013.01)

(58) Field of Classification Search
CPC ..................................... G02B 5/3016
See application file for complete search history.

(56) References Cited

U.S. PATENT DOCUMENTS

| | | | |
|---|---|---|---|
| 2007/0085948 A1* | 4/2007 | Kim .................. | G02F 1/133632 349/114 |
| 2007/0085951 A1* | 4/2007 | Hale ................... | G02F 1/13363 349/117 |
| 2007/0263152 A1* | 11/2007 | Mazaki ................ | G02B 5/3083 349/130 |
| 2009/0117293 A1* | 5/2009 | Shin ....................... | G02B 5/305 428/1.2 |
| 2011/0170039 A1* | 7/2011 | Bos .................... | G02F 1/133753 349/88 |
| 2014/0307317 A1* | 10/2014 | Jeon ........................ | G02B 1/08 359/489.07 |

(Continued)

FOREIGN PATENT DOCUMENTS

| | | |
|---|---|---|
| CN | 101842741 A | 9/2010 |
| CN | 103353696 A | 10/2013 |

(Continued)

*Primary Examiner* — Sang V Nguyen
(74) *Attorney, Agent, or Firm* — Dentons US LLP

(57) ABSTRACT

The present application relates to an optical filter and an organic light-emitting display device. The optical filter of the present application has excellent omnidirectional anti-reflection performance and color characteristics on the side as well as the front. The optical filter can be applied to an organic light-emitting device to improve visibility.

13 Claims, 6 Drawing Sheets

(56) References Cited

U.S. PATENT DOCUMENTS

| | | | |
|---|---|---|---|
| 2015/0301352 A1 | 10/2015 | Wang | |
| 2016/0187554 A1 | 6/2016 | Lee et al. | |
| 2016/0211486 A1* | 7/2016 | Ohyama | G02F 1/133634 |
| 2017/0363790 A1* | 12/2017 | Ooishi | G02F 1/13363 |
| 2018/0120631 A1* | 5/2018 | Lee | G02B 5/20 |
| 2018/0122836 A1* | 5/2018 | Kang | H01L 33/60 |
| 2018/0143361 A1* | 5/2018 | Yakabe | G02B 5/3016 |
| 2018/0329125 A1* | 11/2018 | Hikita | G09F 9/30 |
| 2020/0279979 A1* | 9/2020 | Lee | H01L 27/156 |

FOREIGN PATENT DOCUMENTS

| | | |
|---|---|---|
| CN | 103389536 A | 11/2013 |
| CN | 103998959 A | 8/2014 |
| CN | 104813202 A | 7/2015 |
| CN | 105742319 A | 7/2016 |
| JP | 2004-309597 A | 11/2004 |
| JP | 2015-210459 A | 11/2015 |
| JP | 2016-126342 A | 7/2016 |
| KR | 10-2009-0122138 A | 11/2009 |
| KR | 10-2014-0077580 A | 6/2014 |
| KR | 10-2015-0038834 A | 4/2015 |
| KR | 10-1623086 B1 | 5/2016 |
| KR | 10-2016-0079687 A | 7/2016 |
| KR | 10-2016-0110672 A | 9/2016 |
| KR | 10-2016-0146731 A | 12/2016 |
| KR | 10-1683940 B1 | 12/2016 |
| KR | 10-2017-0040563 A | 4/2017 |
| TW | 201534992 A | 9/2015 |
| WO | 2016-047465 A1 | 3/2016 |
| WO | 2016/121856 A1 | 8/2016 |

* cited by examiner

[Figure 1]
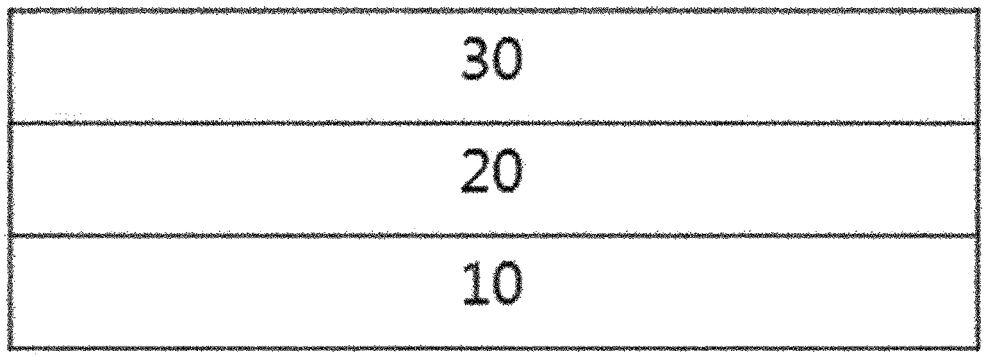
[Figure 2]
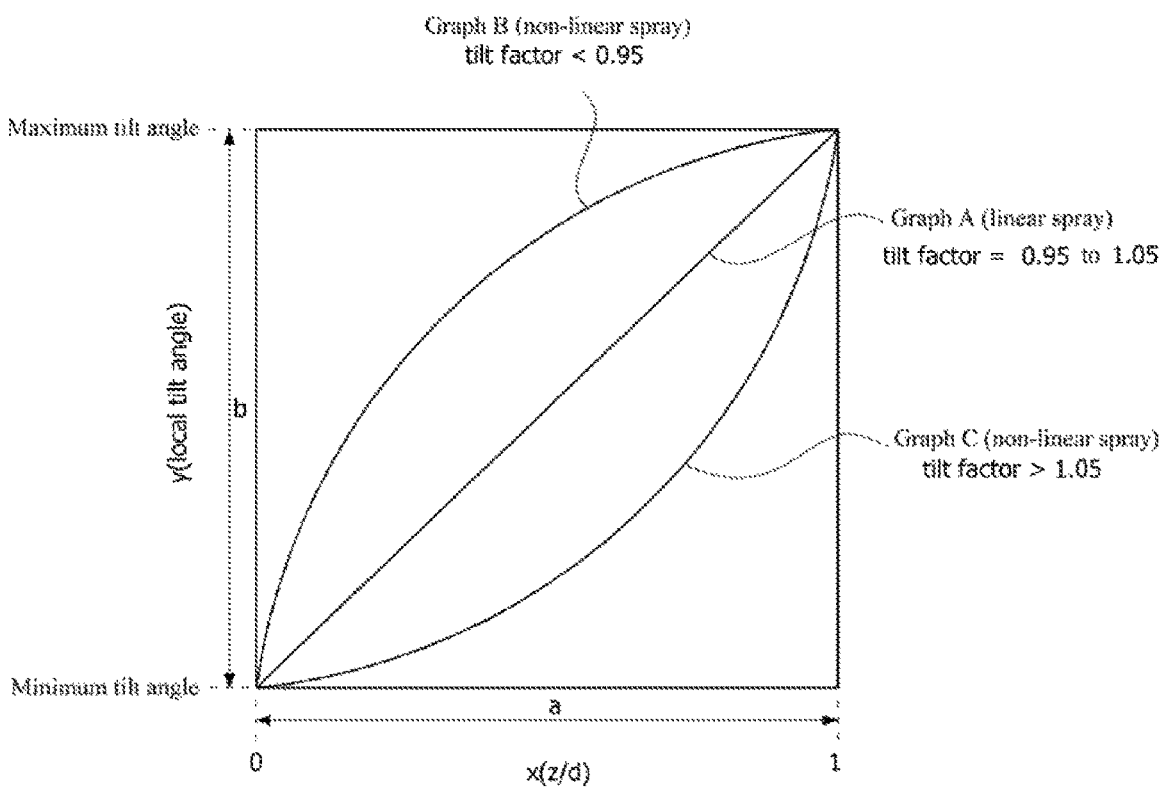

[Figure 3]
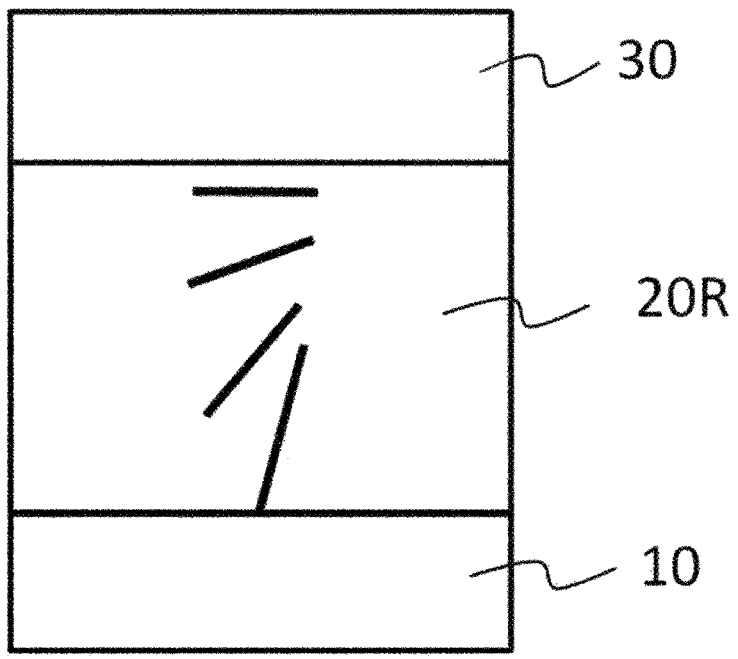
[Figure 4]
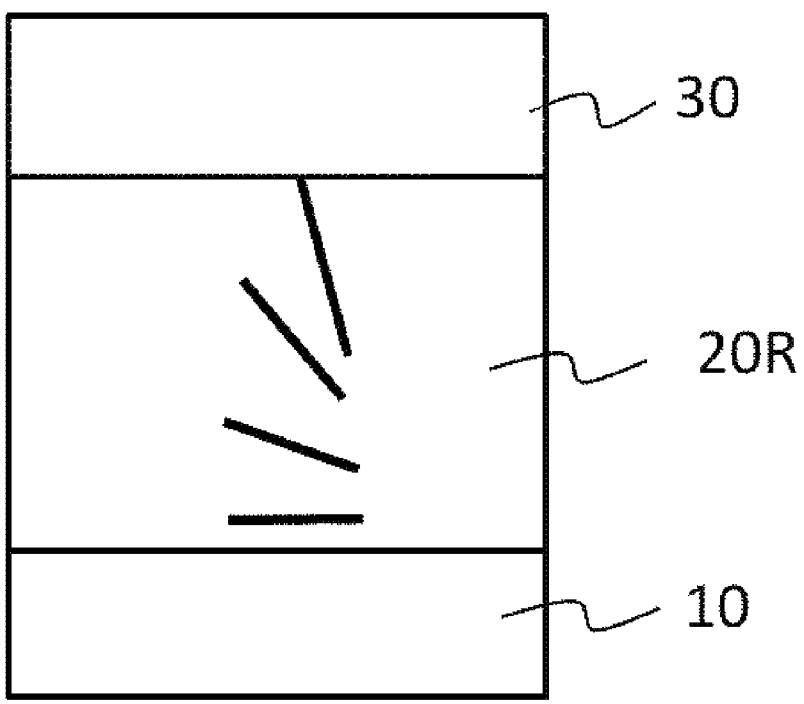

[Figure 5]
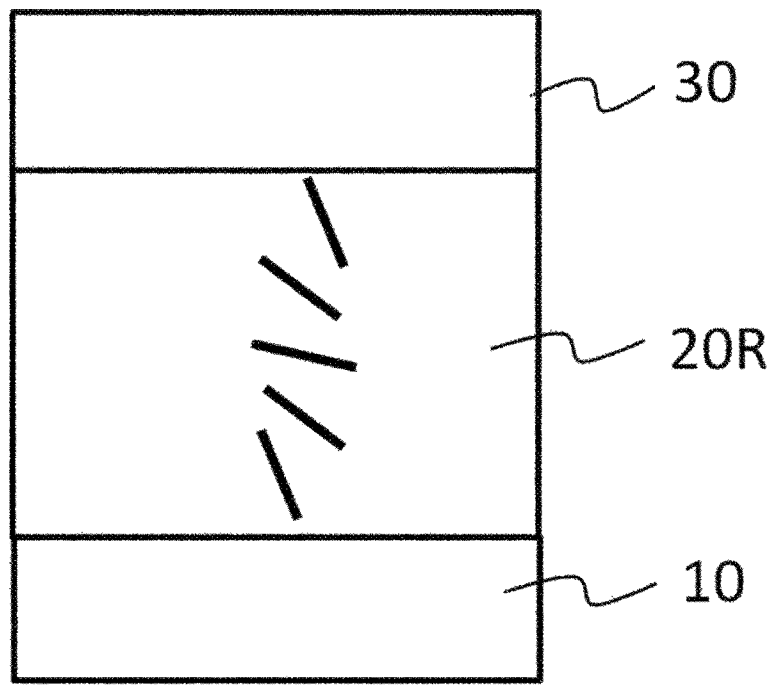
[Figure 6]
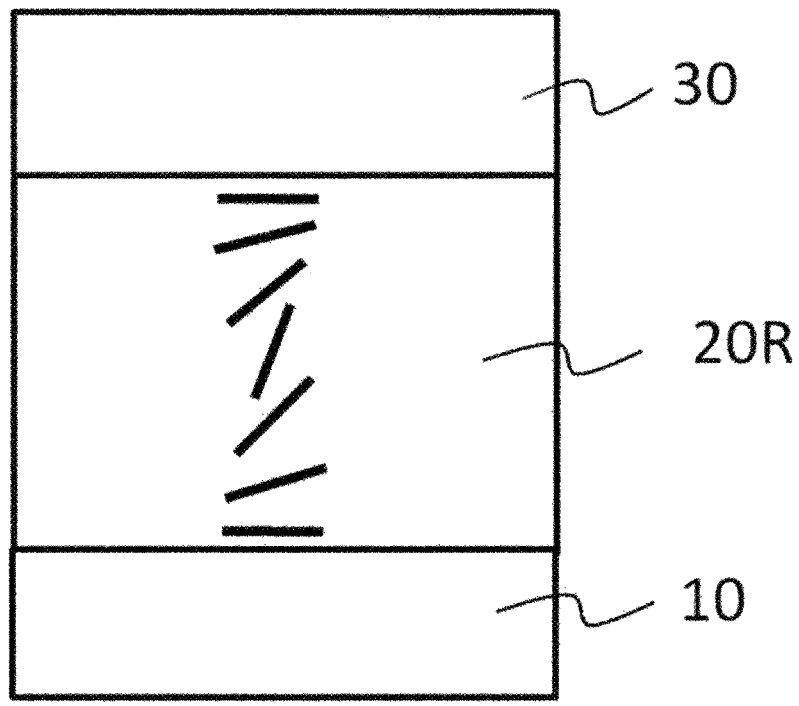

[Figure 7]
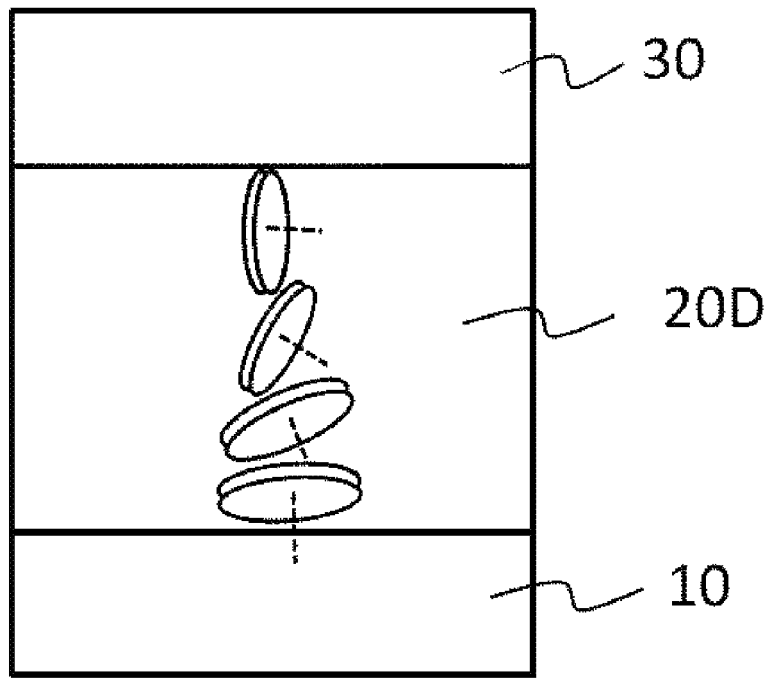
[Figure 8]
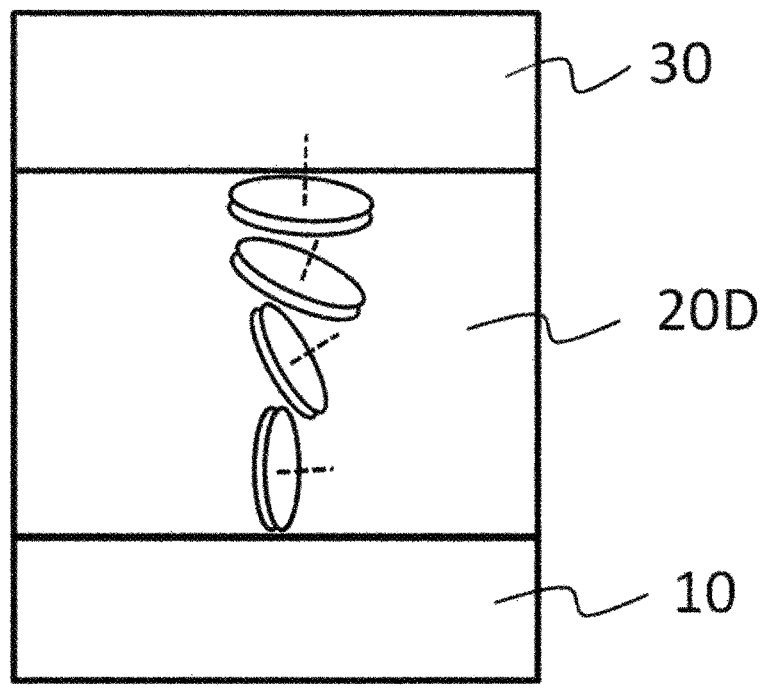

[Figure 9]
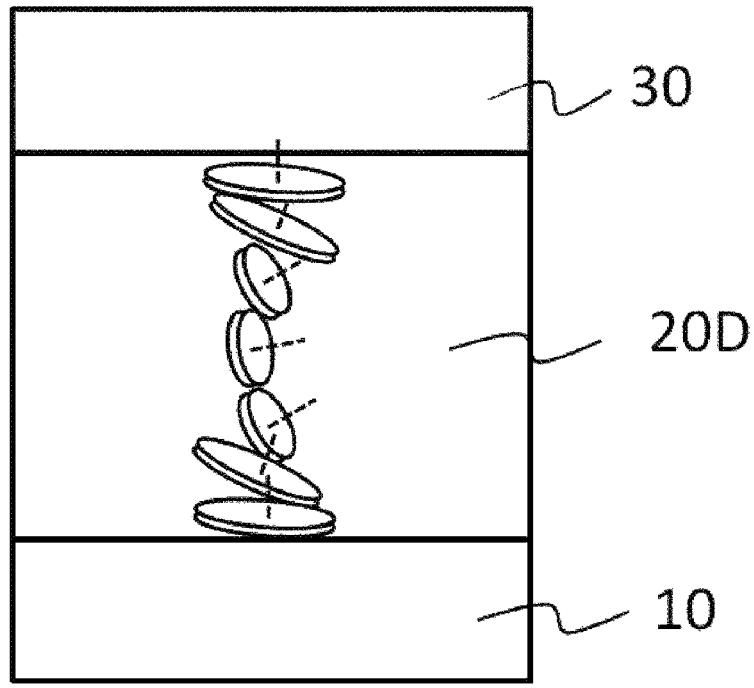
[Figure 10]
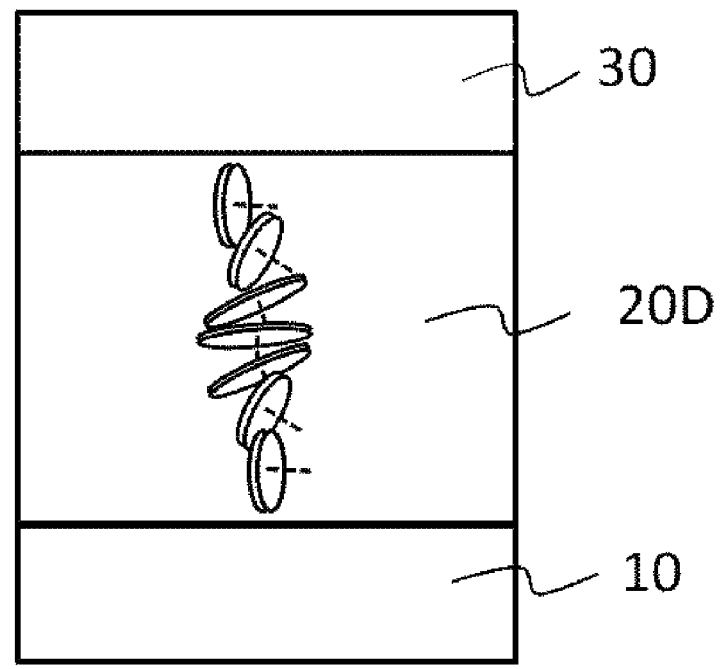

[Figure 11]
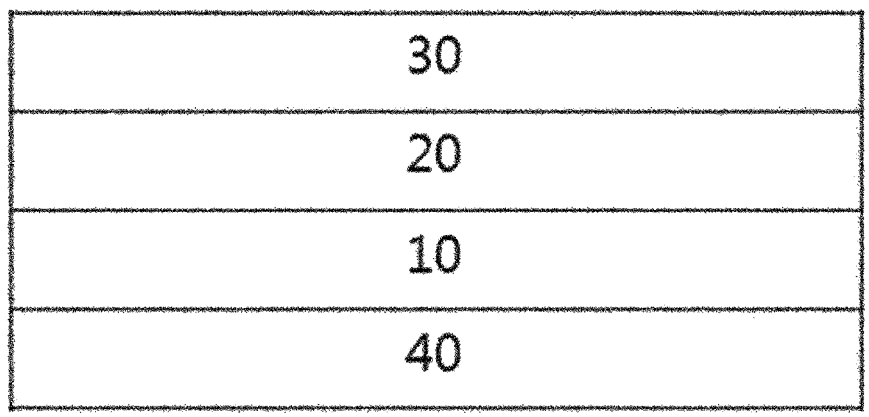
[Figure 12]
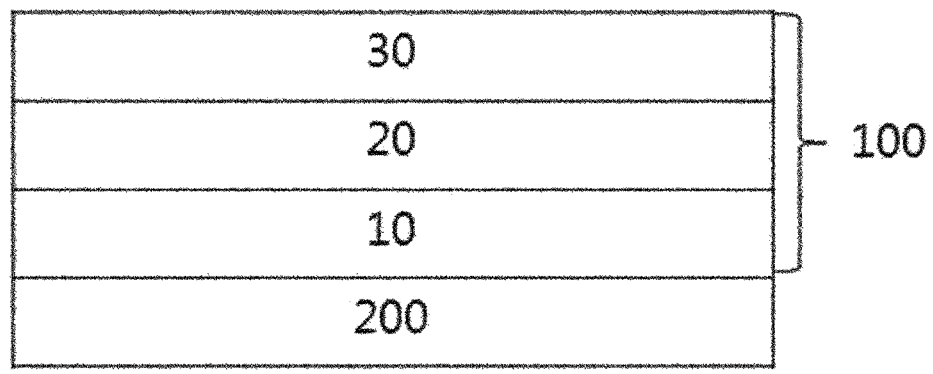

OPTICAL FILTER FOR ANTI-REFLECTION AND ORGANIC LIGHT-EMITTING DEVICE

The present application is a National Phase entry pursuant to 35 U.S.C. § 371 of International Application No. PCT/KR2018/004628 filed on Apr. 20, 2018, and claims priority to and the benefit of Korean Patent Application No. 10-2017-0050948 filed on Apr. 20, 2017, the disclosures of which are incorporated herein by reference in their entirety.

FIELD

The present application relates to an optical filter for anti-reflection and an organic light-emitting device.

BACKGROUND

Recently, there has been a demand for weight reduction and thinning of monitors or televisions, and the like, and organic light-emitting devices (OLEDs) have been attracting attention in response to this demand. The organic light-emitting device is a self-luminescent display device emitting light by itself, which requires no separate backlight, so that the thickness can be reduced, and is advantageous to realize a flexible display device.

On the other hand, the organic light-emitting device can reflect external light by the metal electrode and the metal wiring formed on the organic light-emitting display panel, where visibility and a contrast ratio may be lowered due to the reflected external light, thereby deteriorating the display quality. A circular polarizing plate may be attached to one side of the organic light-emitting display panel, as in Patent Document 1 (Korean Laid-Open Patent Publication No. 2009-0122138), to reduce leakage of the reflected external light to the outside.

However, the currently developed circular polarizing plate has strong viewing angle dependence, and thus an antireflection performance deteriorates toward the side, so that there is a problem that the visibility is lowered.

It is a problem to be solved by the present application to provide an optical filter having excellent omnidirectional antireflection performance and color characteristics on the side as well as the front, and an organic light-emitting device having improved visibility by applying the optical filter.

SUMMARY

Thus, according to certain aspects, the present invention provides an optical filter for anti-reflection sequentially comprising: a first retardation film having an in-plane optical axis and having quarter-wave phase retardation characteristics, a second retardation film having a plurality of optical axes in which tilt angles change along the thickness direction, and a polarizer having an absorption axis formed in one direction.

Further, an organic light-emitting device may be provided comprising the optical filter as described above, and an organic light-emitting display panel.

BRIEF DESCRIPTION OF THE DRAWINGS

FIG. 1 is an exemplary cross-sectional diagram of an optical filter according to one example of the present application.

FIG. 2 is a graph for explaining splay alignment.

FIGS. 3 to 6 are exemplary cross-sectional diagrams of an optical filter to which rod-shaped liquid crystal molecules are applied.

FIGS. 7 to 10 are exemplary cross-sectional diagrams of an optical filter to which disc-shaped liquid crystal molecules are applied.

FIG. 11 is an exemplary cross-sectional diagram of an optical filter to which a C-plate is applied.

FIG. 12 is a cross-sectional diagram of an organic light-emitting device according to one example of the present application.

DETAILED DESCRIPTION

The present application relates to an optical filter for anti-reflection. FIG. 1 schematically shows the optical filter. As shown in FIG. 1, the optical filter may comprise a first retardation film (10), a second retardation film (20) and a polarizer (30), sequentially. The first retardation film (10) may have an in-plane optical axis and have quarter-wave phase retardation characteristics. The second retardation film (20) may have a plurality of optical axes whose tilt angles change along the thickness direction. The second retardation film (20) having such characteristics can be referred to as a splay film. The polarizer (30) may have an absorption axis formed in one direction.

In this specification, "polarizer" means an element exhibiting selective transmission and absorption characteristics with respect to incident light. For example, the polarizer can transmit light that vibrates in any one direction from incident light that vibrates in various directions, and absorb light that vibrates in the other directions.

The polarizer (30) included in the optical filter may be a linear polarizer. In this specification, a linear polarizer means a case where the selectively transmitting light is a linearly polarized light that vibrates in any one direction and the selectively absorbing light is a linearly polarized light that vibrates in a direction orthogonal to the vibration direction of the linearly polarized light.

As the linear polarizer, for example, a polarizer in which iodine is dyed on a polymer stretched film such as a PVA stretched film, or a guest-host polarizer in which a liquid crystal polymerized in an aligned state is used as a host and an anisotropic dye arranged depending on the alignment of the liquid crystal is used as a guest, may be used, without being limited thereto.

According to one example of the present application, a PVA stretched film can be used as the polarizer. The transmittance or polarization degree of the polarizer can be appropriately adjusted in consideration of the object of the present application. For example, the transmittance of the polarizer may be from 42.5% to 55%, and the polarization degree may be from 65% to 99.9997%.

In this specification, when the term such as vertical, horizontal, orthogonal or parallel is used while defining an angle, it means substantially vertical, horizontal, orthogonal, or parallel to the extent that the desired effect is not impaired, which includes, for example, an error that takes a production error or a deviation (variation), and the like, into account. For example, each case of the foregoing may include an error within about ±15 degrees, an error within about ±10 degrees or an error within about ±5 degrees.

In this specification, "retardation film" is an optically anisotropic element, which may mean an element capable of converting incident polarized light by controlling birefringence. While describing an x-axis, y-axis and z-axis of the retardation film herein, unless otherwise specified, the x-axis means a direction parallel to an in-plane slow axis of the retardation film, the y-axis means a direction parallel to an in-plane fast axis of the retardation film, and the z-axis means a thickness direction of the retardation film. The x-axis and y-axis may be orthogonal to each other in the plane. While describing an optical axis of the retardation film herein, unless otherwise specified, it means a slow axis. When the retardation film comprises rod-shaped liquid crystal molecules, the slow axis may mean the long axis direction of the rod shape, and when it comprises disc-shaped liquid crystal molecules, the slow axis may mean the normal direction of the disc shape. While describing the refractive index of the retardation film herein, unless otherwise specified, it means a refractive index for light of a wavelength of about 550 nm.

In this specification, the in-plane retardation (Rin) of the retardation film is calculated by Equation 1 below.

$$Rin = d \times (nx - ny) \quad \text{[Equation 1]}$$

In Equation 1, Rin is an in-plane retardation, d is a thickness of the retardation film, and nx and ny are refractive indexes in the x-axis and y-axis directions as defined above, respectively. While describing the in-plane retardation of the retardation film herein, unless otherwise specified, it means an in-plane retardation for light of a wavelength of about 550 nm.

In this specification, "reverse wavelength dispersion characteristic" may mean a characteristic satisfying Equation 2 below, the "normal wavelength dispersion characteristic" may mean a characteristic satisfying Equation 3 below, and the "flat wavelength dispersion characteristic" may mean a characteristic satisfying Equation 4 below.

$$R(450)/R(550) < R(650)/R(550) \quad \text{[Equation 2]}$$

$$R(450)/R(550) > R(650)/R(550) \quad \text{[Equation 3]}$$

$$R(450)/R(550) = R(650)/R(550) \quad \text{[Equation 4]}$$

In Equations 2 to 4, R ($\lambda$) is an in-plane retardation of the retardation film for light of $\lambda$ nm.

In this specification, the retardation film satisfying Equation 5 below can be called a so-called +A plate.

$$nx > ny = nz \quad \text{[Equation 5]}$$

In Equation 5, nx, ny and nz are refractive indexes in the x-axis, y-axis and z-axis directions as defined above, respectively.

The first retardation film may have an in-plane optical axis. The first retardation film may have an optical axis parallel to the plane direction. The optical axis of the first retardation film may form about 40 degrees to 50 degrees, about 43 degrees to 47 degrees, specifically about 45 degrees with the absorption axis of the polarizer.

The first retardation film may have a quarter-wave phase retardation characteristic. In this specification, the term "n-wave phase retardation characteristic" may mean a characteristic that the incident light may be phase-delayed by n times the wavelength of the incident light within at least a part of the wavelength range. Therefore, the quarter-wave phase retardation characteristic may mean a characteristic that the incident light may be phase-delayed by a quarter times the wavelength of the incident light within at least a part of the wavelength range. The in-plane retardation of the first retardation film for light having a wavelength of 550 nm may be 120 nm to 160 nm. Specifically, the in-plane retardation may be 120 nm or more, 130 nm or more, 135 nm or more, and may be 160 nm or less, 150 nm or less, or 140 nm or less.

The first retardation film may have reverse wavelength dispersion characteristics. For example, the first retardation film may have a property that the in-plane retardation increases, as the wavelength of incident light increases. The wavelength of the incident light may be, for example, 300 nm to 800 nm.

In one example, the R (450)/R (550) value of the first retardation film may be 0.81 to 0.99. The R (450)/R (550) value may be specifically 0.81 or more, or 0.82 or more, and may be 0.99 or less, 0.95 or less, 0.9 or less, 0.88 or less, or 0.86 or less. The value of R (650)/R (550) of the first retardation film has a value larger than the value of the R (450)/R (550), and for example, may be 1.01 to 1.19, 1.05 to 1.15, or 1.09 to 1.11.

The first retardation film may be a uniaxial retardation film. For example, the first retardation film may be a +A plate satisfying Equation 5 above.

The first retardation films may be a polymer film. As the polymer film, a film comprising polyolefin such as PC (polycarbonate), norbonene resin, PVA (poly(vinyl alcohol)), PS (polystyrene), PMMA (poly(methyl methacrylate) and PP (polypropylene), PA (poly(arylate)), PA (polyamide), PET (poly(ethylene terephthalate)) or PS (polysulfone), and the like can be used. The polymer film may be stretched or shrunk under appropriate conditions to impart birefringence and used as the first retardation films.

The first retardation film may be a liquid crystal film. The liquid crystal film may comprise liquid crystal molecules in a state of being aligned and polymerized. The liquid crystal molecule may be a polymerizable liquid crystal molecule. In this specification, the polymerizable liquid crystal molecule may mean a molecule containing a moiety capable of exhibiting liquid crystallinity, such as a mesogen skeleton, and containing at least one polymerizable functional group. Also, to comprise polymerizable liquid crystal molecules in a polymerized form may mean a state in which the liquid crystal molecules are polymerized to form a skeleton, such as a main chain or side chain of the liquid crystal polymer in the liquid crystal film. The liquid crystal film may comprise the liquid crystal molecules, for example, in a horizontally aligned state. In this specification, "horizontal alignment" may mean a state where the slow axis of the liquid crystal film containing liquid crystal molecules is aligned horizontally with respect to the plane of the liquid crystal film.

The second retardation film may have a plurality of optical axes whose tilt angles change along the thickness direction. In this specification, the tilt angle may mean the minimum angle formed by the local optical axis and the plane of the retardation film. The local optical axis may have a tilt angle of 0 degrees to 90 degrees.

In this specification, the thickness direction may mean a direction parallel to a virtual line connecting one main surface of the retardation film or the liquid crystal layer and the main surface opposite thereto at the shortest distance. In this specification, the first surface of the second retardation film may mean a surface in contact with the first retardation film, and the second surface may mean a surface in contact with the polarizer. In this specification, the middle part of the thickness direction in the second retardation film may mean a point of the thickness direction which is one half of the total thickness of the second retardation film.

The tilt direction of the optical axis of the second retardation film may be parallel or orthogonal to the absorption axis of the polarizer. In this specification, the tilt direction of the optical axis of the second retardation film may mean projection of all the optical axes of the second retardation film onto the plane of the second retardation film.

The second retardation film may have, for example, a thickness of 0.3 µm to 5 µm. Specifically, the thickness may be 0.3 µm or more, 0.6 µm or more, 0.9 µm or more, 1 µm or more, 1.2 µm or more, 1.5 µm or more, 1.8 µm or more, 2 µm or more, 2.2 µm or more, or 2.5 µm or more, and may be 5 µm or less, 4.5 µm or less, 4 µm or less, 3.5 µm or less, 3.0 µm or less, 2.5 µm or less, 2.2 µm or less, or 2 µm or less. It is possible to provide an optical filter having excellent antireflection characteristics in all directions within the above thickness range. The thickness of the second retardation film can be adjusted within the above range according to the structure of the optical filter as described below, thereby further improving the omnidirectional antireflection characteristics.

The second retardation film may have a normal wavelength dispersion characteristic. In one example, the R (450)/R (550) value of the second retardation film may be 1.01 to 1.19, 1.05 to 1.15, or 1.09 to 1.11. The value of R (650)/R (550) of the second retardation film has a value smaller than that of the R (450)/R (550), which may be 0.81 to 0.99, 0.85 to 0.95, or 0.89 to 0.91. The second retardation film may have a reverse wavelength dispersion characteristic. The details of the reverse wavelength dispersion characteristic may be applied equally by those described in the item of the first retardation film. In one example, the R (450)/R (550) value of the second retardation film may be 0.81 to 0.99, 0.85 to 0.95, or 0.89 to 0.91. The value of R (650)/R (550) of the second retardation film has a value larger than that of the R (450)/R (550), which may be 1.01 to 1.19, 1.05 to 1.15, or 1.09 to 1.11. When the second retardation film has the reverse wavelength dispersion characteristic, an effect of further improving the reflectance characteristic and the color shift characteristic can be obtained.

The second retardation film may comprise a liquid crystal layer. The liquid crystal layer may comprise liquid crystal molecules. The liquid crystal layer may comprise liquid crystal molecules having refractive index anisotropy of 0.03 to 0.2. In this specification, the refractive index anisotropy (Δn) may mean a value of extraordinary refractive index (ne)—ordinary refractive index (no). In this specification, the extraordinary refractive index may mean the refractive index in the slow axis direction of the liquid crystal layer, and the ordinary refractive index may mean the refractive index in the fast axis direction of the liquid crystal layer.

The liquid crystal layer may comprise rod-shaped liquid crystal molecules or disc-shaped liquid crystal molecules.

The rod-shaped liquid crystal molecule may comprise a compound having a rod-like structure, the molecular structure of which is substituted by a linear alkyl group or alkoxy group, a substituted benzoyloxy group or the like, and showing liquid crystallinity. As such rod-shaped liquid crystal molecules, a liquid crystal compound known to form a so-called nematic phase can be used. In this specification, the term "nematic phase" may mean a liquid crystal phase sequentially arranged along the long axis direction without regularity for the position of the liquid crystal molecules. In one example, the rod-shaped liquid crystal compound may have a crosslinkable or polymerizable functional group. The crosslinkable or polymerizable functional group is not particularly limited, but may be exemplified by, for example, an alkenyl group, an epoxy group, a cyano group, a carboxyl group, an acryloyl group, a methacryloyl group, an acryloyloxy group or a methacryloyloxy group.

The disc-shaped liquid crystal molecule may comprise a compound having a discotic structure, in which the molecule center is a mother nucleus and a linear alkyl group or alkoxy group, a substituted benzoyloxy group, or the like, is radially substituted as a linear chain, and showing liquid crystallinity. As such, disc-shaped liquid crystal molecules, a liquid crystal compound known to form a so-called discotic phase, can be used. In general, a disc-shaped liquid crystal compound is one having a negative refractive index anisotropy (uniaxial), which may include, for example, benzene derivatives described in C. Destrade et al. Mol. Cryst. Vol. 71, page 111 (1981); cyclohexane derivatives described in B. Kohne et al. Angew. Chem. Vol. 96, page 70 (1984); and azacrown-based or phenylacetylene-based macrocycles described in J. M. Lehn et al., J. Chem. Commun., page 1794 (1985) and J. Zhang et al., J. Am. Chem. Soc. Vol. 116, page 2655 (1994), and the like. In one example, the discotic phase liquid crystal compound may have a crosslinkable or polymerizable functional group. The crosslinkable or polymerizable functional group is not particularly limited, but may be exemplified by, for example, an alkenyl group, an epoxy group, a cyano group, a carboxyl group, an acryloyl group, a methacryloyl group, an acryloyloxy group or a methacryloyloxy group.

The liquid crystal layer may comprise the liquid crystal molecules in a splay alignment state. In this specification, the splay alignment means an alignment state in which the tilt angle of the liquid crystal molecules present in the liquid crystal layer gradually changes along the thickness direction of the liquid crystal layer.

The splay alignment can be divided into a linear splay alignment and a non-linear splay alignment. In this specification, the linear splay alignment means an alignment state in which a graph plotting the thickness of the liquid crystal layer as the x axis, and the local tilt angle corresponding to the thickness as the y axis, forms a linear plot. That is, an alignment state in which the gradient is a constant. In one example, the linear splay alignment may mean an alignment state in which the graph formed by setting a ratio (z/d) of the corresponding thickness (z) to the total thickness (d) of the liquid crystal layer as the x axis (that is, x=0 to 1.0), and setting the local tilt angle corresponding to the relevant thickness as the y axis, provided that the interval (b) between the minimum tilt angle and the maximum tilt angle in the y axis is set to be equal to an interval (a) within a range of x=0 to 1.0, has a constant gradient along the x axis, for example, an alignment state in which the average gradient (tilt factor) is in a range of about 0.95 to 1.05 (see Graph A in FIG. 2).

Alternatively, a non-linear splay alignment herein means an alignment state in which the graph formed by setting the thickness of the liquid crystal layer as the x axis, and the local tilt angle corresponding to the thickness as the y axis, forms a non-linear plot. That is, an alignment state in which the gradient is changed along the thickness of the liquid crystal layer. In one example, the non-linear splay alignment may mean an alignment state in which the gradient of the tilt angle to the thickness of the liquid crystal layer gradually increases or gradually decreases. In one example, the non-linear splay alignment may mean an alignment state in which the graph formed by setting a ratio (z/d) of the corresponding thickness (z) to the total thickness (d) of the liquid crystal layer as the x axis (that is, x=0 to 1.0), and setting the local tilt angle corresponding to the relevant thickness as the y axis, provided that the interval (b) between the minimum tilt angle and the maximum tilt angle in the y axis is set to be equal to an interval (a) within a range of x=0 to 1.0, forms a gradually decreasing gradient along the x axis, provided that the average gradient (tilt factor) is less than about 0.95 (see Graph B in FIG. 2), or forms a gradually increasing gradient along the x axis, provided that the average gradient (tilt factor) is more than about 1.05 (see Graph C in FIG. 2).

FIGS. 3 to 6 are exemplary cross-sectional diagrams of optical filters in which rod-shaped liquid crystal molecules are applied to a second retardation film (20R). In FIGS. 3 to 6, the symbol "-" denotes a rod-shaped liquid crystal molecule. FIG. 3 is illustrative of a case in which the second retardation film (20R) has the maximum tilt angle at the first surface and the minimum tilt angle at the second surface, where the tilt angle gradually changes along the thickness direction. FIG. 4 is illustrative of a case in which the second retardation film (20R) has the minimum tilt angle at the first surface and the maximum tilt angle at the second surface, where the tilt angle gradually changes along the thickness direction. FIG. 5 is illustrative of a case in which the tilt angle gradually changes along the thickness direction such that the second retardation film (20R) has the maximum tilt angle at the first surface or the second surface and the minimum tilt angle at the middle part in the thickness direction. FIG. 6 is illustrative of a case in which the tilt angle gradually changes along the thickness direction such that the second retardation film (20R) has the minimum tilt angle at the first surface or the second surface and the maximum tilt angle at the middle part in the thickness direction.

FIGS. 7 to 10 are exemplary cross-sectional diagrams of an optical filter in which disc-shaped liquid crystal molecules are applied to a second retardation film (20D). In FIGS. 7 to 10, the disc appearance represents a disc-shaped liquid crystal molecule. FIG. 7 is illustrative of a case in which the second retardation film (20D) has the maximum tilt angle at the first surface and the minimum tilt angle at the second surface, where the tilt angle gradually changes along the thickness direction. FIG. 8 is illustrative of a case in which the second retardation film (20D) has the minimum tilt angle at the first surface and the maximum tilt angle at the second surface, where the tilt angle gradually changes along the thickness direction. FIG. 9 is illustrative of a case in which the tilt angle gradually changes along the thickness direction such that the second retardation film (20D) has the maximum tilt angle at the first surface or the second surface and the minimum tilt angle at the middle part in the thickness direction. FIG. 10 is illustrative of a case in which the tilt angle gradually changes along the thickness direction such that the second retardation film (20D) has the minimum tilt angle at the first surface or the second surface and the maximum tilt angle at the middle part in the thickness direction.

The liquid crystal layer comprising the splay-aligned liquid crystal molecules can be prepared by curing a layer of a composition comprising known splay-aligned liquid crystal molecules. Here, the curing can be performed by radiating ultraviolet rays to the layer of the splay-aligned liquid crystal composition, where the tilt factor of the splay-aligned liquid crystal layer can be controlled by adjusting the temperature at the time of ultraviolet irradiation. For example, the higher the temperature at the time of ultraviolet irradiation, the more the tilt factor tends to increase.

The optical filter of the present application can effectively improve omnidirectional antireflection performance and color characteristics on the side as well as the front by controlling the optical properties of the second retardation film.

In one example, the second retardation film may comprise rod-shaped liquid crystal molecules. Hereinafter, the optical properties of the second retardation film capable of effectively improving omnidirectional antireflection performance and color characteristics on the side as well as on the front will be described according to the structure of the optical filter.

In the optical filter having the structure of FIG. 3 or 4, the optical axes of the second retardation film (20R) may be gradually changed along the thickness direction of the film so as to have a tilt angle of 60 degrees to 90 degrees at one surface of the film and a tilt angle of 0 degrees to 20 degrees at the other surface opposite thereto. The tilt angle of one surface may be specifically 60 degrees or more, 65 degrees or more, 70 degrees or more, 75 degrees or more, or 80 degrees or more, and may be 90 degrees or less, 88 degrees or less, 86 degrees or less, or 85 degrees or less. The tilt angle of the other surface may be specifically 0 degrees or more, or 2 degrees or more, and may be 20 degrees or less, 15 degrees or less, 10 degrees or less, 8 degrees or less, or 5 degrees or less.

In the optical filter having the structure of FIG. 5, the optical axes of the second retardation film (20R) may be gradually changed along the thickness direction of the film so as to have tilt angles of 70 degrees to 90 degrees at both surfaces of the film, respectively and a tilt angle of 0 degrees to 70 degrees at the middle part in the thickness direction of the film. The tilt angles at both surfaces may be 90 degrees or less and 70 degrees or more, 75 degrees or more, 80 degrees or more, or 85 degrees or more, and the tilt angle at the middle part may be 0 degrees or more, 10 degrees or more, or 20 degrees or more and may be 70 degrees or less, 60 degrees or less, 50 degrees or less, 40 degrees or less, or 30 degrees or less.

In the optical filter having the structure of FIG. 6, the optical axes of the second retardation film (20R) may be gradually changed along the thickness direction of the film so as to have tilt angles of 0 degrees to 20 degrees at both surfaces of the film, respectively and a tilt angle of 40 degrees to 90 degrees at the middle part in the thickness direction of the film. The tilt angles at both surfaces may be 0 degrees or more and 20 degrees or less, 10 degrees or less, 5 degrees or less, 3 degrees or less, or 1 degree or less, and the tilt angle at the middle part may be 40 degrees or more, 45 degrees or more, or 50 degrees or more, and may be 90 degrees or less, 80 degrees or less, 60 degrees or less, or 55 degrees or less.

According to a first example of the present application, the projection of all the optical axes of the second retardation film onto the plane is parallel to the absorption axis of the polarizer, where the optical axis of the second surface in the second retardation film may have a tilt angle of 0 degrees to 10 degrees, the optical axis of the first surface may have a tilt angle of 75 degrees to 90 degrees and the second retardation film may have a thickness of 1 m to 2 μm. The tilt angle at the second surface may be, for example, 0 degrees or more, or 2 degrees or more, and may be 10 degrees or less, 8 degrees or less, 6 degrees or less, or 4 degrees or less. The tilt angle at the first surface may be, for example, 75 degrees or more, 80 degrees or more, or 83 degrees or more, and may be 90 degrees or less, 88 degrees or less, or 86 degrees or less. The thickness may be 1 μm or more, or 1.1 μm or more, and may be 2 μm or less, 1.5 μm or less, or 1.3 μm or less.

According to a second example of the present application, the projection of all the optical axes of the second retardation film onto the plane is parallel to the absorption axis of the polarizer, where the optical axis of the second surface in the second retardation film may have a tilt angle of 75 degrees to 90 degrees, the optical axis of the first surface may have a tilt angle of 0 degrees to 10 degrees and the second retardation film may have a thickness of 0.5 µm to 2 µm. The tilt angle at the second surface may be, for example, 75 degrees or more, or 78 degrees or more, and may be 90 degrees or less, 85 degrees or less, or 82 degrees or less. The tilt angle at the first surface may be, for example, 0 degrees or more, 2 degrees or more, or 4 degrees or more, and may be 10 degrees or less, 8 degrees or less, or 6 degrees or less. The thickness may be 0.5 µm or more, or 0.7 µm or more, and may be 2 µm or less, 1.5 m or less, or 1 µm or less.

According to a third example of the present application, the projection of all the optical axes of the second retardation film onto the plane is orthogonal to the absorption axis of the polarizer, where the optical axis of the second surface in the second retardation film may have a tilt angle of 0 degrees to 10 degrees, the optical axis of the first surface may have a tilt angle of 75 degrees to 90 degrees and the second retardation film may have a thickness of 0.3 µm to 1 µm. The tilt angle at the second surface may be, for example, 0 degrees or more, or 1 degrees or more, and may be 10 degrees or less, 8 degrees or less, 6 degrees or less, or 4 degrees or less. The tilt angle at the first surface may be, for example, 75 degrees or more, 80 degrees or more, or 82 degrees or more, and may be 90 degrees or less, 88 degrees or less, 86 degrees or less, or 84 degrees or less. The thickness may be 0.3 µm or more, or 0.5 µm or more, and may be 1 µm or less, 0.8 µm or less, or 0.7 µm or less.

According to a fourth example of the present application, the projection of all the optical axes of the second retardation film onto the plane is parallel to the absorption axis of the polarizer, where the tilt angles at both surfaces of the second retardation film may be 70 degrees to 90 degrees, respectively, the tilt angle at the middle part in the thickness direction of the film may be 0 degrees to 30 degrees and the film may have a thickness of 0.5 µm to 1.5 µm. The tilt angle at both surfaces may be, for example, 90 degrees or less, and may be 70 degrees or more, 80 degrees or more, or 85 degrees or more. The tilt angle of the middle part may be 0 degrees or more, 10 degrees or more, 15 degrees or more, 20 degrees or more, or 22 degrees or more, and may be 30 degrees or less, 28 degrees or less, or 26 degrees or less. The thickness may be, for example, 0.5 µm or more, 0.7 µm or more, 0.9 µm or more, or 1 µm or more, and may be 1.5 µm or less, 1.3 µm or less, or 1.1 µm or less.

According to a fifth example of the present application, the projection of all the optical axes of the second retardation film onto the plane is parallel to the absorption axis of the polarizer, where the tilt angles at both surfaces of the second retardation film may be 0 degrees to 30 degrees, respectively, the tilt angle at the middle part in the thickness direction of the film may be 50 degrees to 90 degrees and the film may have a thickness of 0.5 µm to 1.5 µm. The tilt angle at both surfaces may be, for example, 0 degrees or more, and may be 30 degrees or less, 20 degrees or less, 10 degrees or less, or 5 degrees or less, and the tilt angle of the middle part may be 50 degrees or more, and may be 90 degrees or less, 80 degrees or less, 70 degrees or less, 60 degrees or less, or 55 degrees or less. The thickness may be, for example, 0.5 µm or more, 0.7 µm or more, 0.9 µm or more, or 1 µm or more, and may be 1.5 µm or less, 1.3 µm or less, or 1.2 µm or less.

In another example, the second retardation film may comprise disc-shaped liquid crystal molecules. Hereinafter, the optical properties of the second retardation film capable of effectively improving omnidirectional antireflection performance and color characteristics on the side as well as on the front will be described according to the structure of the optical filter.

In the optical filter having the structure of FIG. 7 or 8, the optical axes of the second retardation film (20D) may be gradually changed along the thickness direction of the film so as to have a tilt angle of 60 degrees to 90 degrees at one surface of the film and a tilt angle of 0 degrees to 20 degrees at the other surface opposite thereto. The tilt angle of one surface may be specifically 90 degrees or less, and may be 60 degrees or more, 70 degrees or more, 80 degrees, or 85 degrees or more. The tilt angle of the other surface may be specifically 0 degree or more, or 2 degrees or more, and may be 20 degrees or less, 15 degrees or less, 10 degrees or less, 5 degrees or less, or 3 degrees or less.

In the optical filter having the structure of FIG. 9, the optical axes of the second retardation film (20D) may be gradually changed along the thickness direction of the film so as to have tilt angles of 70 degrees to 90 degrees at both surfaces of the film, respectively, and a tilt angle of 0 degrees to 30 degrees at the middle part of the thickness direction of the film. The tilt angles of both surfaces may be 70 degrees or more, 75 degrees or more, 80 degrees or more, or 84 degrees or more, and may be 90 degrees or less, 88 degrees or less, or 86 degrees or less. The tilt angle of the middle part may be 0 degree or more, 5 degrees or more, or 10 degrees or more, and may be 30 degrees or less, 20 degrees or less, or 15 degrees or less.

In the optical filter having the structure of FIG. 10, the optical axes of the second retardation film (20D) may be gradually changed along the thickness direction of the film so as to have tilt angles of 0 degrees to 20 degrees at both surfaces, respectively, and a tilt angle of 20 degrees to 50 degrees at the middle part of the thickness direction of the film. The tilt angles of both surfaces may be 0 degrees or more, or 2 degrees or more, and may be 20 degrees or less, 15 degrees or less, 10 degrees or less, 5 degrees or less, or 3 degrees or less. The tilt angle of the middle part may be 20 degrees or more, 25 degrees or more, 30 degrees or more, or 35 degrees or more, and may be 50 degrees or less, or 40 degrees or less.

According to a sixth example of the present application, the projection of all the optical axes of the second retardation film onto the plane is parallel to the absorption axis of the polarizer, where the axis of the second surface in the second retardation film may have a tilt angle of 0 degrees to 10 degrees, the axis of the first surface in the second retardation film may have a tilt angle of 70 degrees to 90 degrees and the second retardation film may have a thickness of 3 µm to 5 µm. The tilt angle at the second surface may be, for example, 0 degrees or more, and may be 10 degrees or less, 8 degrees or less, 6 degrees or less, 4 degrees or less, 2 degrees or less, or 1 degree or less. The tilt angle at the first surface may be, for example, 70 degrees or more, 72 degrees or more, 74 degrees or more, 76 degrees or more, or 78 degrees or more, and may be 90 degrees or less, 88 degrees or less, 86 degrees or less, 84 degrees or less, or 82 degrees or less. The thickness may be, for example, 3 µm or more, 3.2 m or more, 3.4 m or more, 3.6 µm or more, 3.8 µm or more, and may be 5 µm or less, 4.8 m or less, 4.6 µm or less, or 4.2 µm or less.

According to a seventh example of the present application, the projection of all the optical axes of the second retardation film onto the plane is parallel to the absorption axis of the polarizer, where the optical axis of the second surface in the second retardation film may have a tilt angle of 60 degrees to 90 degrees or 70 degrees to 90 degrees, the axis of the first surface in the second retardation film may have a tilt angle of 0 degrees to 10 degrees and the second retardation film may have a thickness of 1 µm to 3 µm. The tilt angle at the second surface may be, for example, 70 degrees or more, 75 degrees or more, 80 degrees or more, or 83 degrees or more, and may be 90 degrees or less, or 87 degrees or less. The tilt angle at the first surface may be, for example, 0 degrees or more, or 1 degree or more, and may be 10 degrees or less, 8 degrees or less, 6 degrees or less, 4 degrees or less, or 3 degrees or less. The thickness may be 1 µm or more, 1.3 µm or more, or 1.6 µm or more, and may be 3 µm or less, 2.5 µm or less, or 2 µm or less.

According to an eighth example of the present application, the projection of all the optical axes of the second retardation film onto the plane is parallel to the absorption axis of the polarizer, where the optical axes of the second retardation film may have tilt angles of 0 degrees to 10 degrees at the first surface and the second surface of the film, respectively and a tilt angle of 30 degrees to 70 degrees at the middle part of the thickness direction of the film, and the second retardation film may have a thickness of 0.7 µm to 2.5 µm. The tilt angles at the first surface and the second surface may be, for example, 0 degrees or more, or 1 degree or more, and may be 10 degrees or less, 8 degrees or less, 6 degrees or less, 4 degrees or less, or 3 degrees or less. The tilt angle of the middle part may be, for example, 5 degrees or more, 10 degrees or more, 20 degrees or more, 30 degrees or more, or 35 degrees or more, and may be 40 degrees or less. The thickness may be 2 µm or more, or 2.1 µm or more, and may be 3 m or less, 2.8 µm or less, 2.6 µm or less, 2.4 µm or 2.3 µm or less.

According to a ninth example of the present application, the projection of all the optical axes of the second retardation film onto the plane is orthogonal to the absorption axis of the polarizer, where the optical axes of the second retardation film may have tilt angles of 70 degrees to 90 degrees at the first surface and the second surface of the film, respectively and a tilt angle of 5 degrees to 40 degrees at the middle part of the thickness direction of the film, and the second retardation film may have a thickness of 2 µm to 3 µm. The tilt angles at the first surface and the second surface may be, for example, 70 degrees or more, 75 degrees or more, 80 degrees or more, or 82 degrees or more, and may be 90 degrees or less, or 87 degrees or less. The tilt angle at the middle part may be, for example, 5 degrees or more, 10 degrees or more, or 12 degrees or more, and may be 40 degrees or less, 30 degrees or less, 25 degrees or less, 20 degrees or less, 16 degrees or less, or 15 degrees or less. The thickness may be, for example, 2 µm or more, 2.2 µm or more, or 2.4 µm or more, and may be 3 µm or less, 2.8 µm or less, or 2.6 µm or less.

The optical filter may further comprise a C plate. As shown in FIG. 11, the C plate (40) may be disposed on the outer side of the first retardation film (10), that is, on the opposite side where the second retardation film (20) is disposed. In this specification, the term C plate may mean a retardation film satisfying Equation 6 below.

$$nx=ny<nz \quad \text{[Equation 6]}$$

In Equation 6, nx, ny, and nz are refractive indices in the x-axis, y-axis, and z-axis directions as defined above, respectively.

The C plate may comprise a polymer material or a UV curable liquid crystal film. As the usable film, a homeotropic aligned liquid crystal film, a biaxially stretched PC (polycarbonate) or the like may be included.

The optical filter may further comprise a surface treatment layer. The surface treatment layer may be exemplified by an antireflection layer or the like. The surface treatment layer may be disposed on the outer side of the polarizer, that is, on the opposite side where the second retardation film is disposed. As the antireflection layer, a laminate of two or more layers having different refractive indexes or the like may be used, without being limited thereto.

The first retardation film, the second retardation film, and the polarizer of the optical filter may be attached to each other through a pressure-sensitive adhesive or an adhesive, or may be laminated to each other by direct coating. An optical transparent pressure-sensitive adhesive or adhesive may be used as the pressure-sensitive adhesive or adhesive.

The optical filter may have a reflectance of less than 5%, 4% or less, 3% or less, 2% or less, 1% or less, 0.8% or less, 0.6% or less, 0.4% or less, or 0.2% or less, as measured at a tilt angle of 60 degrees. The reflectance may be a reflectance for light of any wavelength in the visible light region, for example, a reflectance for light of any wavelength in a range of 380 nm to 780 nm, or a reflectance for light belonging to the entire visible light region. The reflectance may be, for example, the reflectance measured on the polarizer side of the optical filter. The reflectance may be a reflectance measured at a specific azimuth angle of a tilt angle of 60 degrees or an azimuth angle of a predetermined range, or may mean a reflectance measured for all azimuth angles at a tilt angle of 60 degrees or a maximum reflectance measured for all azimuth angles at a tilt angle of 60 degrees, which is a value measured in the manner described in examples to be mentioned below.

The optical filter of the present application can prevent the reflection of external light, thereby improving the visibility of the organic light-emitting device. While incident unpolarized light (hereinafter referred to as "external light") incident from the outside passes through a polarizer, one polarized orthogonal component, that is, a first polarized orthogonal component, of two polarized orthogonal components may be only transmitted and the polarized light may be changed to circularly polarized light while passing through the first retardation film. While the circularly polarized light is reflected from a display panel of an organic light-emitting display device comprising a substrate, an electrode, and the like, the rotational direction of the circularly polarized light is changed and the circularly polarized light is converted to the other polarized orthogonal component of two polarized orthogonal components, that is, a second polarized orthogonal component while passing through the first retardation film again. The second polarized orthogonal component does not pass through the polarizer and thus does not emit light to the outside, so that it can have an effect of preventing reflection of external light.

The optical filter of the present application can also effectively prevent the reflection of external light incident from the side, thereby improving the lateral visibility of the organic light-emitting device. For example, it is also possible to effectively prevent the reflection of external light incident from the side through viewing angle polarization compensation principle.

The optical filter of the present application can be applied to an organic light-emitting device. FIG. 12 is a cross-sectional diagram exemplarily showing an organic light-emitting device. Referring to FIG. 12, the organic light-emitting device comprises an organic light-emitting display panel (200) and an optical filter (100) positioned on one side of the organic light-emitting display panel (200). The first retardation film (10) of the optical filter may be disposed adjacent to the organic light-emitting display panel (200) as compared with the polarizer (30).

The organic light-emitting display panel may comprise a base substrate, a lower electrode, an organic light-emitting layer, an upper electrode and a sealing substrate, and the like. One of the lower electrode and the upper electrode may be an anode and the other may be a cathode. The anode is an electrode into which holes are injected, which may be made of a conductive material having a high work function, and the cathode is an electrode into which electrons are injected, which may be made of a conductive material having a low work function. At least one of the lower electrode and the upper electrode may be made of a transparent conductive material that the emitted light can come out to the outside, and may be, for example, ITO or IZO. The organic light-emitting layer may comprise an organic material capable of emitting light when a voltage has been applied to the lower electrode and the upper electrode.

Additional layers may be further included between the lower electrode and the organic light-emitting layer and between the upper electrode and the organic light-emitting layer. The additional layer may include a hole transporting layer, a hole injecting layer, an electron injecting layer and an electron transporting layer for balancing electrons and holes, but is not limited thereto. The sealing substrate may be made of glass, metal, and/or a polymer, and may seal the lower electrode, the organic light-emitting layer, and the upper electrode to prevent moisture and/or oxygen from being introduced from the outside.

The optical filter (100) may be disposed on the side where the light comes out from the organic light-emitting display panel (200). For example, in the case of a bottom emission structure in which light is emitted toward the base substrate, it may be disposed outside the base substrate, and in the case of a top emission structure in which light is emitted toward the sealing substrate, it may be disposed outside the sealing substrate. The optical filter (100) can improve display characteristics of the organic light-emitting device by preventing external light from being reflected by the reflective layer made of metal such as electrodes and wiring of the organic light-emitting display panel (200) and from coming out of the organic light-emitting device. In addition, since the optical filter (100) can exhibit an antireflection effect on the side as well as the front, as described above, the lateral visibility can be improved.

The optical filter of the present application has excellent omnidirectional antireflection performance and color characteristics on the side as well as the front, and the optical filter can be applied to an organic light-emitting device to improve visibility.

EXAMPLES

Hereinafter, the contents will be described in more detail through Examples and Comparative Examples, but the scope of the present application is not limited to the following contents.

Examples 1 to 10

For simulation evaluation of reflectance and color characteristics, a structure, in which an OLED panel, a first retardation film, a second retardation film and a polarizer were sequentially arranged, was set.

The polarizer has an absorption axis in one direction and a single transmittance (Ts) of 42.5%, and the OLED panel is a Galaxy S6.

The first retardation film was set so that it had an in-plane optical axis, the Rin value for a wavelength of 550 nm was 137.5 nm, the R (450)/R (550) was 0.84 and the optical axis formed 45 degrees with the absorption axis of the polarizer.

The second retardation film is a linear splay film having a plurality of optical axes whose tilt angles gradually change along the thickness direction. The optical properties of the second retardation films in Examples 1 to 10 were summarized in Table 1 below. In Table 1, the Δn means the refractive index anisotropy of the liquid crystal molecules included in the splay film, the liquid crystal kind means the shape of the liquid crystal molecules included in the splay film, the optical axis means the angle formed by the projection of the optical axis of the second retardation film onto the plane with the absorption axis of the polarizer, the second surface tilt angle means the optical axis tilt angle of the surface in contact with the polarizer of the splay film, the first surface tilt angle means the optical axis tilt angle of the surface in contact with the first retardation film of the splay film, the middle part tilt angle means the optical axis tilt angle of the thickness point which is one half of the total thickness of the splay film, and the thickness and R (450)/R (550) mean the thickness and R (450)/R (550) of the splay film, respectively.

TABLE 1

| | | | Second Retardation Film | | | | | | | |
|---|---|---|---|---|---|---|---|---|---|---|
| | | Δn | Liquid crystal kind | Optical axis | Second surface tilt angle (%) | First surface tilt angle (%) | Middle part tilt angle (%) | Thickness (μm) | R(450)/R(550) | Maximum reflectance (60°) | Average reflectance (60°) |
| E | 1 | 0.12 | Rod | Parallel | 3 | 85 | — | 1.2 | 1.1 | 0.36 | 0.25 |
| X | 2 | 0.12 | Rod | Parallel | 80 | 5 | — | 0.9 | 1.1 | 0.38 | 0.28 |
| A | 3 | 0.12 | Rod | Orthogonal | 2 | 83 | — | 0.6 | 1.1 | 0.76 | 0.42 |
| M | 4 | 0.12 | Rod | Parallel | 90 | 90 | 24 | 1.05 | 1.1 | 0.36 | 0.18 |
| P | 5 | 0.12 | Rod | Parallel | 0 | 0 | 52 | 1.1 | 1.1 | 0.4 | 0.35 |
| L | 6 | 0.1 | Disc | Parallel | 0.2 | 80 | — | 4.0 | 1.1 | 0.6 | 0.42 |
| E | 7 | 0.1 | Disc | Parallel | 85 | 2 | — | 1.8 | 1.1 | 0.62 | 0.42 |
| | 8 | 0.1 | Disc | Parallel | 2 | 2 | 37 | 2.2 | 1.1 | 0.46 | 0.32 |
| | 9 | 0.1 | Disc | Orthogonal | 85 | 85 | 14 | 2.5 | 1.1 | 0.48 | 0.34 |
| | 10 | 0.06 | Rod | Parallel | 90 | 0 | — | 2 | 0.82 | 0.18 | 0.1 |

Comparative Examples 1 to 5

For simulation evaluation of reflectance and color characteristics, a structure, in which no first retardation film was used and an OLED panel, a second retardation film and a polarizer were sequentially arranged, was set.

The OLED panel and the polarizer are the same as those of Examples 1 to 10.

The optical properties of the second retardation films in Comparative Examples 1 to 5 were summarized in Table 2 below. In Table 2, the second surface tilt angle means the optical axis tilt angle of the surface in contact with the polarizer of the second retardation film, and the first surface tilt angle means the optical axis tilt angle of the surface in contact with the OLED panel of the splay film. The other properties in Table 2 are as defined in Table 1. Comparative Examples 1 to 3 and 5 are linear splay films, and Comparative Example 4 is a +A plate.

TABLE 2

| | | | | Second Retardation Film | | | | | |
|---|---|---|---|---|---|---|---|---|---|
| | | Δn | Liquid crystal kind | Optical axis | Second surface tilt angle (%) | First surface tilt angle (%) | Middle part tilt angle (%) | Thickness (μm) | R(450)/ R(550) | Maximum reflectance (60°) | Average reflectance (60°) |
| Comparative Example | 1 | 0.12 | Rod | Parallel | 3 | 85 | — | 2.4 | 1.1 | 4.7 | 3.5 |
| | 2 | 0.06 | Rod | 45 degrees | 90 | 0 | — | 4.65 | 0.82 | 5.0 | 2.7 |
| | 3 | 0.06 | Rod | 45 degrees | 60 | 0 | — | 3.5 | 0.82 | 1.8 | 1.0 |
| | 4 | 0.06 | Rod | 45 degrees | 0 | 0 | — | 2.28 | 0.82 | 1.3 | 0.65 |
| | 5 | 0.06 | Rod | 45 degrees | 30 | 0 | — | 2.6 | 0.82 | 0.8 | 0.4 |

Evaluation Example 1 Simulation Evaluation of Reflectance

For Examples 1 to 10 and Comparative Examples 1 to 5, the reflectance was subjected to simulation (Dimos software, AUTRONIC-MELCHERS Co., Ltd.) and evaluation at the 60 degree side direction based on the front according to azimuth angles of 0 to 360 degrees, and the results were summarized in Tables 1 and 2. The reflectance means an average reflectance for a wavelength of 400 nm to 700 nm, which is a value measured at the polarizer side. The maximum reflectance (Max.) means the highest reflectance of the reflectance at azimuth angles of 0 to 360 degrees.

It can be confirmed that in Examples 1 to 10 the reflectance was reduced by about 6 to 10 times or more from the side, and a uniform reflectance reduction effect was observed in all directions, as compared with Comparative Examples 1 to 5. In addition, the antireflective property of Example 10 to which a splay film having a reverse wavelength dispersion characteristic is applied is particularly superior.

Comparative Examples 1 to 5 represent high reflectance because the angle between the polarizer and the splay film does not become 45 degrees from the side, whereas Examples 1 to 10 show much lower reflection characteristics than Comparative Examples by the polarization compensation principle of the splay film because the polarizer and the splay film also form 45 degrees from the side.

EXPLANATION OF REFERENCE NUMERALS

10: first retardation film 20: second retardation film 30: polarizer

40: C plate 100: optical filter 200: organic light-emitting display panel

The invention claimed is:

1. An optical filter for anti-reflection sequentially comprising a first retardation film having an in-plane optical axis and having quarter-wave phase retardation characteristics, a second retardation film having a plurality of optical axes, and a polarizer having an absorption axis formed in one direction, wherein the optical axis of the first retardation film forms an angle of 40 degrees to 50 degrees with the absorption axis of the polarizer, wherein the second retardation film comprises a liquid crystal layer comprising liquid crystal molecules in a splay alignment state in which tilt angles of the liquid crystal molecules present in the liquid crystal layer gradually change along the thickness direction of the liquid crystal layer, and a projection of all the optical axes defined by the splay alignment of the second retardation film onto a plane of the second retardation film is parallel or orthogonal to the absorption axis of the polarizer, wherein the liquid crystal molecules include rod-shaped or disc-shaped liquid crystal molecules, and wherein the optical axes of the second retardation film are gradually changed along the thickness direction of the film so as to have tilt angles of 70 degrees to 90 degrees at both surfaces of the film, respectively and a tilt angle of 0 degrees to 70 degrees at the middle part in the thickness direction of the film.

2. The optical filter according to claim 1, wherein the first retardation film satisfies Equation 2 below:

$$R(450)/R(550) < R(650)/R(550) \qquad \text{[Equation 2]}$$

wherein, R (λ) is an in-plane retardation of the retardation film for light of λ nm.

3. The optical filter according to claim 1, wherein the second retardation film has a thickness of 0.3 μm will to 5 μm.

4. The optical filter according to claim 1, wherein the liquid crystal molecules have refractive index anisotropy of 0.03 to 0.2.

5. The optical filter according to claim 1, wherein the liquid crystal layer comprises disc-shaped liquid crystal molecules and the optical axes of the second retardation film are gradually changed along the thickness direction of the film so as to have tilt angles of 70 degrees to 90 degrees at both surfaces of the film, respectively and a tilt angle of 0 degrees to 30 degrees at the middle part in the thickness direction of the film.

6. The optical filter according to claim 1, wherein the liquid crystal layer comprises the rod-shaped liquid crystal molecules and the optical axes of the second retardation film are gradually changed along the thickness direction of the film so as to have tilt angles of 70 degrees to 90 degrees at both surfaces of the film, respectively, and a tilt angle of 0 degrees to 30 degrees at the middle part in the thickness direction of the film.

7. The optical filter according to claim 1, wherein the liquid crystal layer comprises disc-shaped liquid crystal molecules, the projection of all the optical axes of the second retardation film onto the plane of the second retardation film is orthogonal to the absorption axis of the polarizer, the optical axes of the second retardation film have tilt angles of 75 degrees to 90 degrees at both surfaces, respectively and a tilt angle of 5 degrees to 40 degrees at the middle part of the thickness direction of the film, and the second retardation film has a thickness of 2 µm to 3 µm.

8. The optical filter according to claim 1, wherein the liquid crystal layer comprises the rod-shaped liquid crystal molecules, the projection of all the optical axes of the second retardation film onto the plane of the second retardation film is parallel to the absorption axis of the polarizer, the optical axes of the second retardation film have tilt angles of 70 degrees to 90 degrees at both surfaces, respectively and a tilt angle of 0 degrees to 30 degrees at the middle part of the thickness direction of the film, and the second retardation film has a thickness of 0.5 µm to 1.5 µm.

9. An organic light-emitting device comprising the optical filter of claim 1 and an organic light-emitting display panel.

10. The organic light-emitting device according to claim 9, wherein the first retardation film of the optical filter is disposed adjacent to the organic light-emitting display panel as compared with the polarizer.

11. The organic light-emitting device according to claim 1, wherein the liquid crystal molecules have refractive index anisotropy of 0.06-0.12.

12. The optical filter according to claim 1, wherein the splay alignment state is a linear splay alignment state.

13. The organic light-emitting device according to claim 10, wherein the organic light-emitting display panel may comprise a base substrate, a lower electrode, an organic light-emitting layer, an upper electrode and a sealing substrate.

* * * * *